United States Patent [19]

Bestwick

[11] Patent Number: 5,677,924
[45] Date of Patent: Oct. 14, 1997

[54] RESONANT-CAVITY OPTICAL DEVICE

[75] Inventor: Timothy David Bestwick, Oxford, United Kingdom

[73] Assignee: Sharp Kabushiki Kaisha, Osaka, Japan

[21] Appl. No.: 556,711

[22] Filed: Nov. 13, 1995

[30] Foreign Application Priority Data

Nov. 14, 1994 [GB] United Kingdom .................. 9422950

[51] Int. Cl.$^6$ ....................................................... H01S 3/19
[52] U.S. Cl. ................................................ 372/96; 372/46
[58] Field of Search .................................. 372/92, 46, 45, 372/96; 257/99

[56] References Cited

U.S. PATENT DOCUMENTS

| | | | |
|---|---|---|---|
| 5,115,441 | 5/1992 | Ropf et al. | 372/45 |
| 5,245,622 | 9/1993 | Jewell | 372/45 |
| 5,266,503 | 11/1993 | Wang et al. | 437/24 |
| 5,295,147 | 3/1994 | Jewell et al. | 372/45 |

FOREIGN PATENT DOCUMENTS

| | | |
|---|---|---|
| 0540239 | 5/1993 | European Pat. Off. |
| 1382401 | 1/1975 | United Kingdom . |

OTHER PUBLICATIONS

Search Report for UK Appl. 9422950.7, mailed Mar. 6, 1995.
Jewell et al, IEEE Journal of Quantum Electronics, vol. 27, No. 6, Jun. 1991, "Veritcal–Cavity Surface–Emitting Lasers: Deisgn, . . . ".
Matin et al, Electronics Letters, Feb. 1994, vol. 30, No. 4, pp. 318–320, "Optically Transparent Indium–Tin–Oxide (ITO) Ohmic Contacts . . . ".
Cava et al, Appl. Phys. Lett. 64 (16) Apr. 1994, pp. 2071–2072, "GaInO$_3$: A New Transparent Conducting Oxide ".
Gerard et al, Solid–State Electronics, vol. 37, No. 4–6, pp. 1341–1344, 1994, "Photonic Bandgap of Two–Dimensional Dielectric Crystals".
Lee et al, J. Vac. Sci. Technol. A 11(5), Sep./Oct. 1993, pp. 2742–2746, "Electronic and Optical Properties of Room Temperature Sputter".
Scherer et al. Electronics Letters, 18 Jun. 1992, vol. 28, No. 13, pp. 1224–1226, "Fabrication of Low Threshold Voltage Microlasers".
Hasnain et al, Appl. Phys. Lett. 63(10), Sep. 1993, pp. 1307–1309, "Low, Threshold Buried Heterostructure Vertical Cavity Surface . . . ".
Iga et al, IEEE Journal of Quantum Electronics, vol. 24, No. 9, Sep. 1988, "Surface Emitting Semiconductor Lasers".
Search Report for European Appl. 95308104.9, mailed Feb. 28, 1996.
Ishikawa et al, J. Appl. Phys. 66(5), Sep. 1, 1989, "New Double–Heterostructure Indium–Tim Oxide/InGaAsP/ AlGaAs Surface Light–Emitting Diodes . . . ".
Dowling et al, J. Appl. Phys. 75(4), 15 Feb. 1994, "The Photonic Band Edge Laser: A New Approach to Gain Enhancement," pp. 1896–1899.
Schubert et al, Appl. Phys Lett. 60(8), 24 Feb. 1992, "Resonant Cavity Light–Emitting Diode," pp. 921–923.

*Primary Examiner*—James W. Davie

[57] ABSTRACT

A resonant-cavity optical device, eg a vertical cavity surface emitting laser, has a substrate upon which are provided a Bragg reflector multilayer bottom mirror, a semiconductor lower spacer region, an active region, and a dielectric region which surrounds the bottom mirror, the active region and the lower spacer region. An upper spacer region and a top mirror are provided on top of the active region. The top mirror has a window in which a metal terminal is provided. The terminal is in direct contact with the upper spacer region which is formed of a transparent electrically conducting oxide, eg indium tin oxide.

15 Claims, 2 Drawing Sheets

RESONANT-CAVITY OPTICAL DEVICE

BACKGROUND OF THE INVENTION

1. Field of the Invention

This invention relates to a resonant cavity optical device and is more particularly concerned with a resonant-cavity vertical optical device such as a vertical cavity surface emitting laser (VCSEL) or a resonant cavity light emitting diode (RCLED). Such devices are useful in a wide variety of applications including optical communications, optical parallel processing, data storage and displays.

2. Description of the Related Art

Typically, VCSELs comprise an active region providing a source of optical emission, top and bottom mirrors above and below the active region, and a respective spacer region disposed between the active region and each of the top and bottom mirrors, the spacer regions being optically transparent and serving to define, together with the mirrors, the required length of the optical cavity which is arranged to be an integral number of half wavelengths of the light emitted by the laser. Such optical cavity structure is usually epitaxially grown from semiconductor materials, for example (Al,Ga)As or (Al,Ga)(In,P). The mirrors may also be of epitaxially grown semiconductor material, or may be metallic or dielectric multilayers, eg multilayer distributed Bragg reflectors (DBR). Such VCSELS are disclosed typically in "Vertical-Cavity Surface-Emitting Lasers: Design, Growth, Fabrication, Characterisation" by Jewell, J. L., et al, IEEE Journal of Quantum Electronics, vol 27, No. 6, June 1991, pages 1332–1346. The layer structure of a VCSEL is formed on a semiconductor substrate, eg GaAs, and may be arranged to be either top emitting or bottom emitting. In such VCSELs, it is common to arrange for the current supply to the active region to be made by way of top and bottom electrodes with the result that a current flow is established through the mirrors and the spacer regions. Because of this, the electrical conductivity is relatively low. The fact that VCSELs inherently have a low optical quantum efficiency, together with such low electrical conductivity, results in low power efficiency. This is particularly a problem with VCSELs utilising a thin active region since the single pass optical gain thereof is approximately 1% or less, thereby requiring the use of mirrors having very high reflectivities to achieve lasing. This is usually achieved by employing DBR mirrors which can contain as many as 20 to 30 pairs of alternating high and low refractive index semiconductor layers, which exacerbates the low electrical conductivity problem.

An attempt to mitigate this problem is disclosed in U.S. Pat. No. 5,245,622 which provides a stratified electrode disposed between at least the upper mirror and upper spacer element for conducting electrical current into the active region to cause lasing. This structure avoids the need to conduct the current through at least the upper mirror. However, the problem with this approach is that it is necessary to go to the expense of providing as many as four additional layers for each electrode. Additionally, since such layers define part of the optical cavity, it is necessary for them to have a very high degree of optical transparency and to be of very precise thickness. In U.S. Pat. No. 5,245,622, such electrode layers typically comprise high doped AlGaAs layers and low doped InGaP layers.

U.S. Pat. No. 5,115,441 discloses VCSELs in which a dielectric layer having a central aperture is provided upon a top multilayer mirror, with a metallic barrier layer being provided on the dielectric layer but in electrical contact with the mirror through the central aperture. A layer of an optically transparent semiconductor material is provided over the whole of the metal barrier layer and forms a top electrode of the laser. The optically transparent layer has a conductivity ranging from $1 \times 10^3$ to $1 \times 10^5$ $\Omega^{-1} cm^{-1}$, a light transmissivity of at least 80% and an absorption of less than 10%. Cadmium tin oxide and indium tin oxide are described as examples of such optically transparent semiconductor material layer forming the top electrode. The use of indium tin oxide to form the top and bottom ohmic contacts respectively above and below the top and bottom mirrors in a VCSEL is disclosed by Matin, M. A. et al in Electronics Letters, 17th Feb. 1994, vol. 30, pages 318 to 320. However, such designs still require current to pass through the top mirror and the upper spacer region, and so also suffer from the above-described disadvantage of low electrical conductivity.

U.S. Pat. No. 5,266,503 discloses a VCSEL in which an active layer is formed of a sandwich of different layers of aluminium gallium arsenide of various compositions forming. In effect, these layers define what has been referred to above as the active region and the upper and lower spacer regions. In order to improve lasing efficiency, U.S. Pat. No. 5,266,503 proposes the production of insulating regions by oxygen ion implantation into this active layer which thus confines current flow to a small area of the layer and thereby defines an active region of small area. The layers which serve as spacer layers are therefore aluminium gallium arsenide layers.

SUMMARY OF THE INVENTION

We have now found that the above-mentioned problem of low electrical conductivity can be obviated or mitigated in a relatively simple way by forming at least one of the spacer regions, preferably the upper spacer region, of a resonant-cavity optical device from a transparent, electrically conducting oxide.

Thus, in accordance with one aspect of the present invention, there is provided a resonant-cavity optical device comprising an active region, a spacer region, and an electrical terminal which is electrically connected with the active region by way of the oxide spacer region, wherein the spacer region is formed of a transparent, electrically conducting oxide.

By "transparent" as used herein is meant transparent at the emission wavelength of the device.

The device may have top and bottom mirrors with the oxide spacer region being disposed between the top mirror and the active region and a further spacer region being disposed between the active region and the bottom mirror. The electrical terminal may be engaged with the oxide spacer region. With such an arrangement, the top mirror may be a dielectric multilayer mirror.

The device may be a top surface- or bottom surface-emitting laser. Alternatively, the device may be a resonant-cavity light emitting diode.

The transparent, electrically conducting oxide may be tin-doped indium oxide (ITO), antimony-doped tin oxide (ATO) or fluorine-doped tin oxide (FTO), or it may even be a doped $GaInO_3$ material as disclosed by Cava, R. J., et al in Appl. Phys. Lett., 64(16), 18 Apr. 1994, pages 2071–2072, in which there is disclosed the doping of $GaInO_3$, a layered material with a β $Ga_2O_3$ crystal structure, with electrons through the introduction of oxygen deficiency, Sn doping for In or Ge doping for Ga. Such a doped $GaInO_3$ material has the advantage over ITO that it displays good transparency over the whole optical region, and is therefore potentially suitable for use over a wider range of emission wavelengths.

According to another aspect of the present invention, there is provided a method of producing a resonant-cavity optical device comprising forming on a substrate, a lower spacer region, an active region, an upper spacer region and an electrical terminal which is electrically connected with the active region by way of the oxide spacer region, wherein the upper spacer region is formed of a transparent, electrically conducting oxide.

The electrical terminal may be formed on the upper spacer region.

For producing a surface emitting laser, a bottom mirror is provided between the substrate and the lower spacer region, and a top mirror is provided above the upper spacer region.

The expressions "top", "bottom", "upper" and "lower" refer to the positions of the respective regions relative to the substrate upon which such regions have been formed.

The top and bottom mirrors are preferably multilayered distributed Bragg reflectors in which a multiplicity of high and low refractive index semiconductor material layers are provided, the thickness of each layer being equal to $\lambda/4\mu$, wherein $\lambda$ is the emission wavelength of the device and $\mu$ is the refractive index of the semiconductor material. Typically, for a GaAs laser, semiconductors (eg GaAs and AlAs), are employed for forming the mirrors. In the case where the electrical terminal is engaged with the conducive oxide spacer region, the top mirror may be a dielectric, preferably a dielectric multilayer. Alternatively, the top mirror may be comprised by at least one metal layer.

The active region is a region in which electrons and holes combine to provide lasing emission, and may comprise one or more layers or bands of active material, eg(Al,Ga)As. This active region may include a photonic bandgap structure (see Gerard, J. M. et al "Photonic Bandgap of Two-Dimensional Crystals", Solid-State Electronics, vol 37, Nos 4–6, pages 1341–1344).

In one preferred arrangement, the active region and at least one of the spacer regions and, optionally, at least one of the mirrors are provided in a post structure to provide some refractive index waveguiding. In such an arrangement, the post structure may be surrounded with an insulating material, preferably a heat-conductive material having a lower refractive index than the semiconductor forming the active region. This embedding of the post structure can enable surface losses due to non-radiative combination in the active region to be minimised and may improve heat dissipation from the optical cavity.

It will be appreciated from the above that an army of optical devices having a wave-guided structure can be formed relatively simply and easily, and that these devices can be electrically isolated by creating physical breaks between adjacent devices or by electrically isolating them using ion-implantation techniques.

BRIEF DESCRIPTION OF THE DRAWINGS

An embodiment of the present invention will now be described, by way of example, with reference to the accompanying drawings, in which.

DESCRIPTION OF THE PREFERRED EMBODIMENTS

Figure 1:
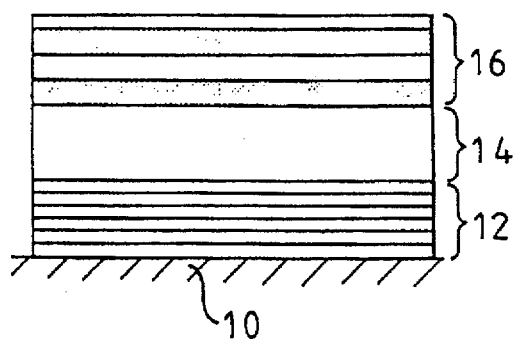
FIGS. 1 to 4 show diagrammatically steps in the manufacture of a VCSEL according to the present invention.

Referring now to FIG. 1, there is illustrated a substrate 10 upon which the following layers have been sequentially epitaxially deposited:

(a) a semiconductive, multilayer distributed Bragg reflector bottom mirror 12 formed by molecular beam epitaxy or the like, (b) a semiconductor lower spacer region 14 formed, for example, of n-doped AlGaAs, and (c) a multi-quantum well active region 16 formed, for example, of four alternating layers of GaAs/AlGaAs.

Figure 2:
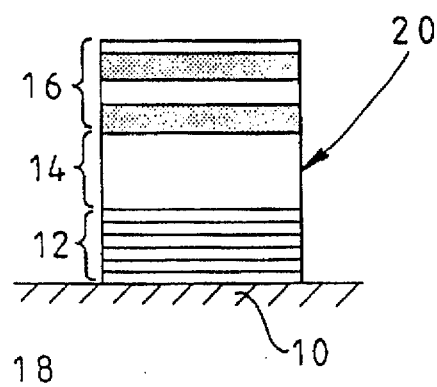
Figure 3:
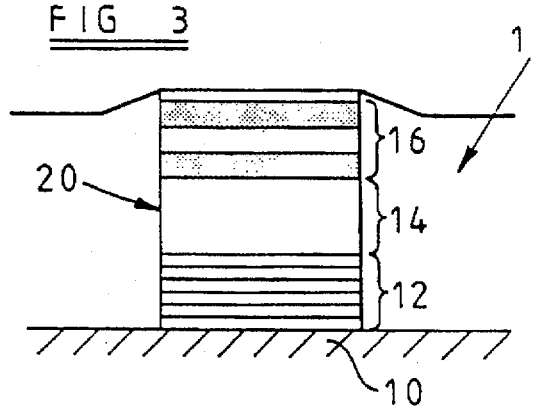

For ease of further fabrication, the structure illustrated in FIG. 1 may be terminated with a thin optically transparent "etch stop" layer (not shown) which may need to be heavily doped to allow the subsequent formation of an ohmic contact to a layer constituting a transparent, electrically conductive upper spacer region 22 which will be described below in relation to FIG. 4. Following this, the structure of FIG. 1 is then patterned to form a post structure 20 (see FIG. 2) using conventional lithography and etching.

The resulting post structure may then be embedded in an insulating dielectric layer 18 which may be "planarised" by etching back using techniques known per se to expose the top of the optical cavity, leaving the insulating dielectric layer 18 surrounding the post 20. This layer 18 may be formed of a dielectric material such as silicon oxide. However, it may alternatively be formed of an electrical insulator that is a relatively good thermal conductor, such as diamond, because such a material will improve heat conduction away from the optical cavity in the device in use.

Figure 4:
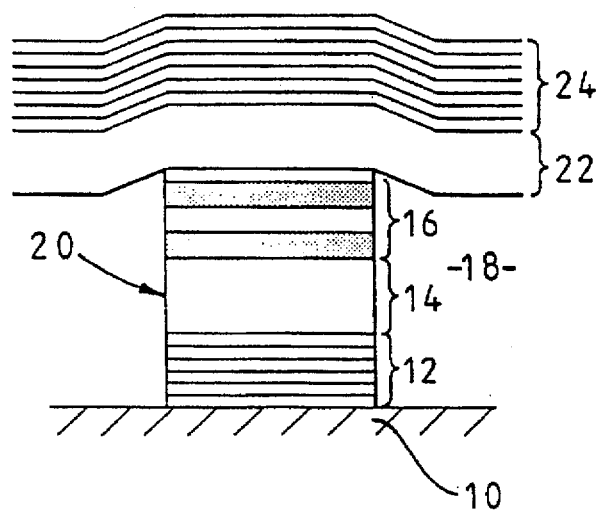

Following this, the transparent, electrically conductive upper spacer region 22 and upper mirror 24 are deposited in turn upon the post 20 and the dielectric layer 18 (FIG. 4). The upper spacer region 22 is formed of tin-doped indium oxide formed by a room temperature sputter deposition process, eg as disclosed by Lee, S. B. et al in J. Vac. Sci. Technol. A 11 (5), Sep/Oct 1993, pages 2742–2746. The upper mirror 24, like the lower mirror 12, is a multilayer distributed Bragg reflector mirror, but instead of being semiconductive, it is dielectric and formed of alternating layers of, for example, silicon oxide and silicon nitride by, for example, reactive sputter deposition (see for example Scherer, A. et al, Electronics Letters 18 Jun. 1992, Vol 28, No. 13, page 1224 et seq). Alternatively, layers of (a) silicon dioxide and titanium dioxide, or (b) amorphous silicon and silicon dioxide, or (c) zirconium dioxide and silicon dioxide, may be used.

Figure 5:
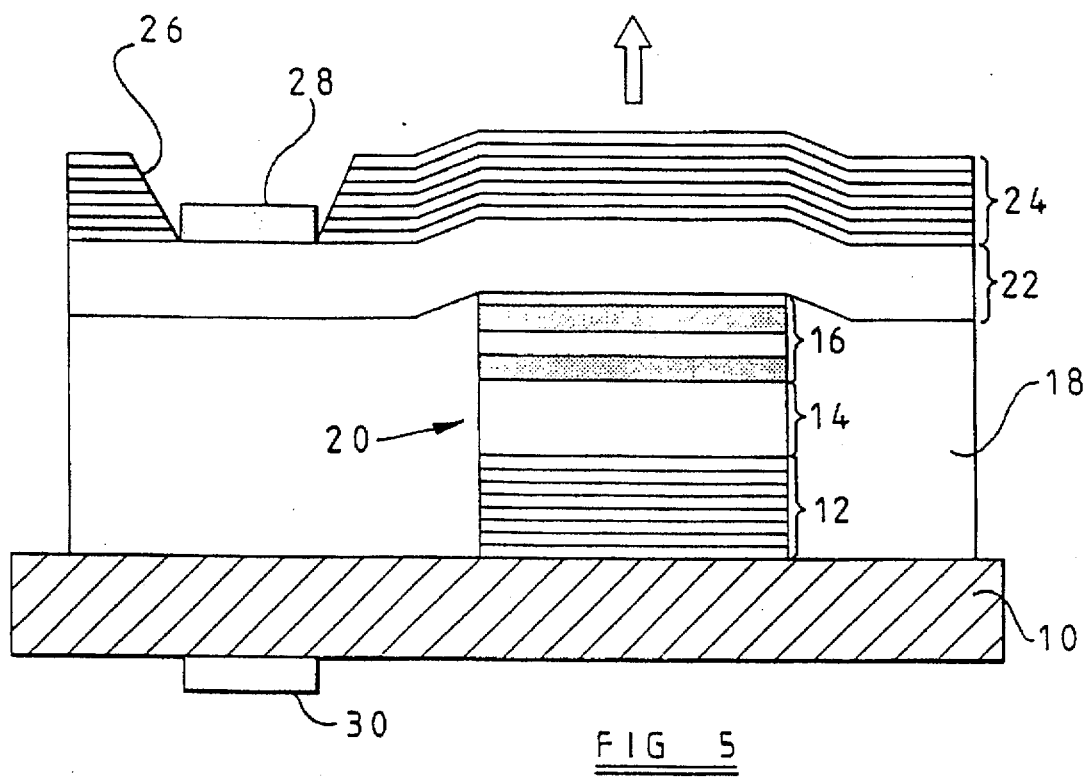
FIG. 5 is a schematic illustration of a top-surface emitting VCSEL.

Referring now to FIG. 5, the structure produced by the steps described above in relation to FIGS. 1 to 4 is utilised to form a top-emitting VCSEL by opening a window 26 in the top mirror 24 and providing a metal terminal 28 therein in contact with the upper spacer layer 22, and by providing a further electrical terminal 30 on the underside of the substrate 10 which is formed of a semiconductor material such as a heavily doped GaAs material.

Figure 6:
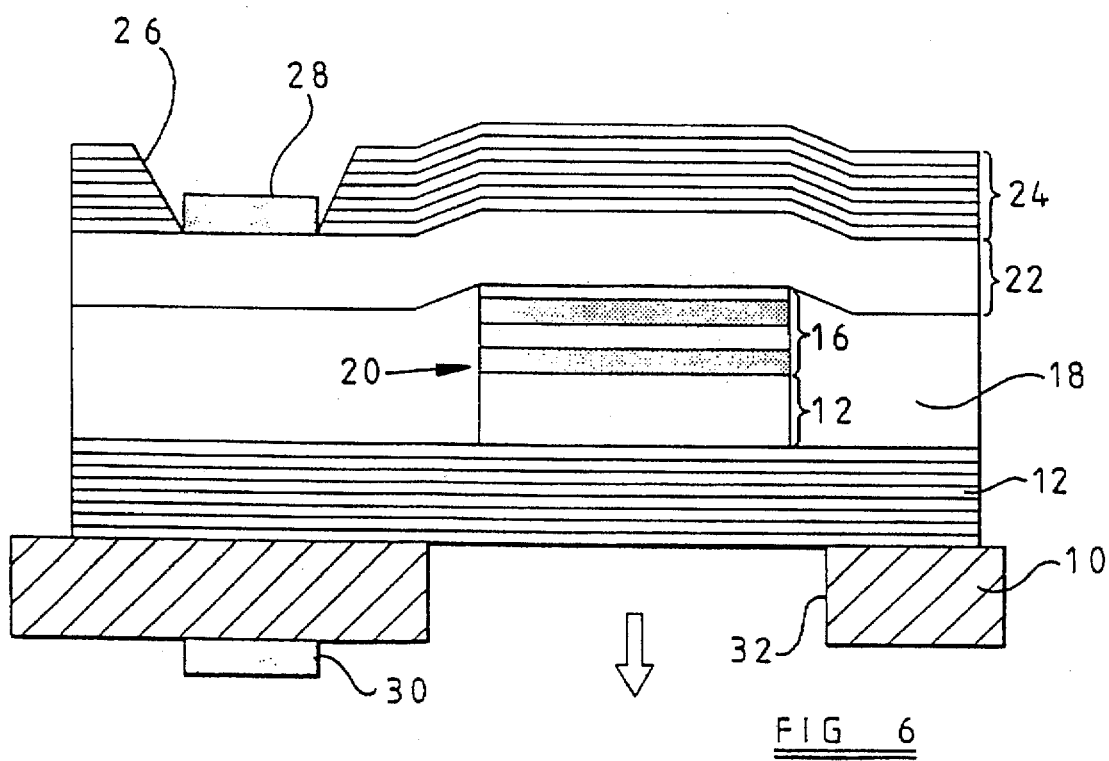
FIG. 6 is a schematic illustration of a bottom-surface emitting VCSEL.

The bottom-emitting VCSEL of FIG. 6 is formed in a similar way to the VCSEL of FIG. 5, except that the post 20 is formed by lithography and etching performed only on the regions 14 and 16 so as to leave the layer forming bottom mirror 12 un-etched. An aperture 32 is provided through the substrate 10 in alignment with the post 20. Alternatively, the material forming the substrate 10 is transparent at the emission wavelength of the laser.

EXAMPLE

In a typical example of the top surface-emitting VCSEL of FIG. 5, the substrate 10 is formed of commercially available n type GaAs. The optical cavity has a total thickness of 588 nm and consists of layer 14 of $n^+$ type $Al_{0.5}Ga_{0.5}As$ which is 203 nm thick, a layer of $Al_{0.3}Ga_{0.7}As$ 50 nm thick (not intentionally doped), a single GaAs 8 nm quantum well (not intentionally doped), a layer of $Al_{0.3}Ga_{0.7}As$ 50 nm thick (not intentionally doped), a layer of $p^+$ type $Al_{0.5}Ga_{0.5}As$ 80 nm thick, and layer 22 of tin-doped indium oxide which is 197 nm thick. The indium oxide contains approximately 10% tin oxide, and is formed by sputter-deposition in an $Ar/O_2$ gas mixture. The bottom mirror 12 is an $n^+$-doped structure comprising 20 pairs of high and low refractive index semiconductor layers. Each high index layer is 60.5 nm thick and is formed of $Al_{0.15}Ga_{0.85}As$, whilst each low index layer is 71.1 nm thick and is formed of AlAs. The top mirror 24 is formed of 12 layers of silicon dioxide 145.5 nm thick alternating with 12 layers of silicon nitride 103.7 nm thick. The insulating dielectric layer 18 has a thickness of approximately 6.2 μm and is formed of silicon dioxide which has been deposited by a plasma-enhanced chemical vapour deposition process. The terminal 28 is formed from layers of Cr and Au. The terminal 30 is formed from layers of AuGe, Ni and Au.

An RCLED device may be made in a similar manner as the above-described VCSEL, except that the top mirror reflectivity will be typically somewhat lower, which is achieved by depositing fewer pairs of dielectric layers in the top mirror.

It will be appreciated from the foregoing that only one lithography step is required to define the device.

In the above description relating to the drawings, the manufacture of only a single device is described. However, it will be appreciated that, in practice, a two dimensional array of VCSELs or RCLEDs can be formed in a single procedure and that electrical isolation between adjacent VCSELs or RCLEDs in the array may be provided by either by ion-implantation or by creating physical breaks in the spacer layer 22 and the mirror layer or layers as necessary.

What is claimed is:

1. A resonant-cavity optical device comprising an active region, an electrical terminal, and a spacer region disposed between said active region and said electrical terminal, wherein said electrical terminal is electrically connected with said active region by way of said spacer region and said spacer region is formed of a transparent, electrically conducting oxide.

2. The device according to claim 1, wherein said electrical terminal is engaged with said oxide spacer region.

3. The device according to claim 1, wherein said transparent, electrically conducting oxide is selected from a group consisting of tin-doped indium oxide, antimony-doped tin oxide, fluorine-doped tin oxide and a transparent electrically conductive $GaInO_3$ material doped with at least one dopant selected from a group consisting of Ge and Sn.

4. The device according to claim 1, further comprising top and bottom mirrors, wherein said oxide spacer region is disposed between said top mirror and said active region, and wherein a further spacer region is disposed between said active region and said bottom mirror.

5. The device according to claim 4, wherein said top mirror is a dielectric multilayer mirror, and wherein said electrical terminal is engaged with said oxide spacer region.

6. The device according to claim 4, wherein the device is a top-surface emitting vertical cavity laser.

7. The device according to claim 4, wherein the device is a bottom-surface emitting vertical cavity laser.

8. The device according to claim 1, wherein the device is a resonant-cavity light emitting diode.

9. The device according to claim 1, wherein said active region has a photonic bandgap structure.

10. The device according to claim 1, wherein at least said active region and said oxide spacer region are defined by a post structure, and wherein a dielectric material surrounds said post structure.

11. The device according to claim 4, wherein said top mirror comprises at least one metal layer.

12. An array comprising a plurality of resonant cavity optical devices, each device comprising an active region, an electrical terminal, and a spacer region disposed between said active region and said electrical terminal, wherein said electrical terminal is electrically connected with said active region by way of said spacer region and said spacer region is formed of a transparent, electrically conducting oxide, and wherein said devices are electrically isolated from one another by ion-implantation.

13. A method of producing a resonant-cavity optical device comprising the steps of forming on a substrate, a lower spacer region, an active region, an upper spacer region and an electrical terminal which is electrically connected with said active region by way of said upper spacer region, wherein said upper spacer region is formed of a transparent, electrically conducting oxide.

14. The method according to claim 13, wherein said step of forming said electrical terminal includes the step of forming said electrical terminal on said upper spacer region.

15. The method according to claim 13, further comprising the steps of forming a bottom mirror between said substrate and said lower spacer region, and forming a top mirror above said upper spacer region.

* * * * *